United States Patent
Saso

(10) Patent No.: US 6,533,163 B2
(45) Date of Patent: Mar. 18, 2003

(54) SOLDER BALL PITCHER

(75) Inventor: Yoshinori Saso, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/925,668

(22) Filed: Aug. 9, 2001

(65) Prior Publication Data

US 2002/0088843 A1 Jul. 11, 2002

(30) Foreign Application Priority Data

Aug. 11, 2000 (JP) ........................................ 2000-249190

(51) Int. Cl.$^7$ .................................................. B23K 1/20

(52) U.S. Cl. ............................ 228/246; 228/33; 228/41

(58) Field of Search ................................. 228/245, 246, 228/33, 41

(56) References Cited

U.S. PATENT DOCUMENTS

| | | | | |
|---|---|---|---|---|
| 5,425,493 A | * | 6/1995 | Interrante | 228/110.1 |
| 5,653,381 A | * | 8/1997 | Azdasht | 228/254 |
| 6,336,581 B1 | * | 1/2002 | Tuchiya et al. | 228/245 |
| 6,386,433 B1 | * | 5/2002 | Razon et al. | 228/13 |

* cited by examiner

Primary Examiner—M. Alexandra Elve
Assistant Examiner—Len Tran
(74) Attorney, Agent, or Firm—Sonnenschein, Nath & Rosenthal

(57) ABSTRACT

There is disclosed a solder ball pitcher supplying a large number of solder balls stored in a solder ball housing chamber in a row into a solder ball supply passage unit through a taper portion, and then delivers the solder balls in sequence through a solder ball supply opening at the tip end of the solder ball supply passage unit by a swing motion of the release link in case of allowing a release lever reciprocated by a pusher and a compressive coil spring to translate by a parallel link composed of the release link and a follower link.

4 Claims, 9 Drawing Sheets

FIG.6
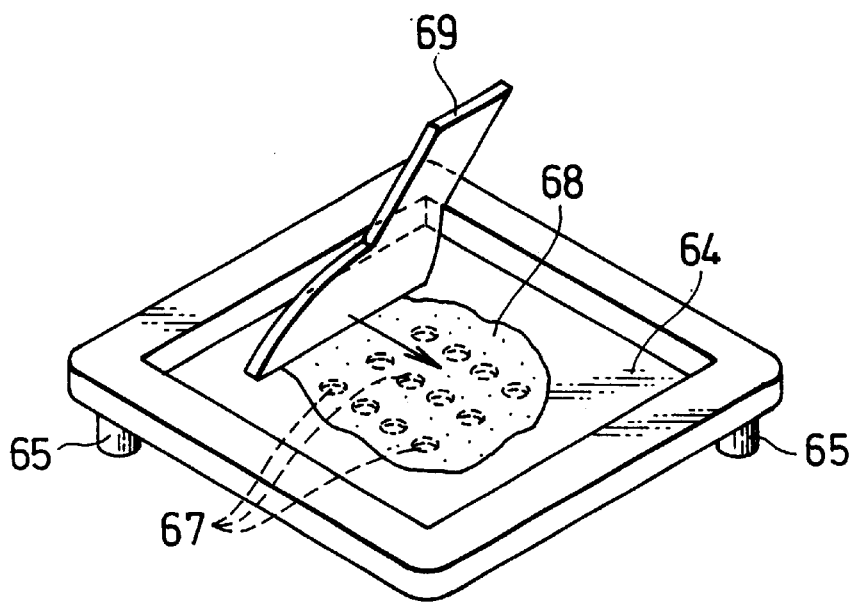
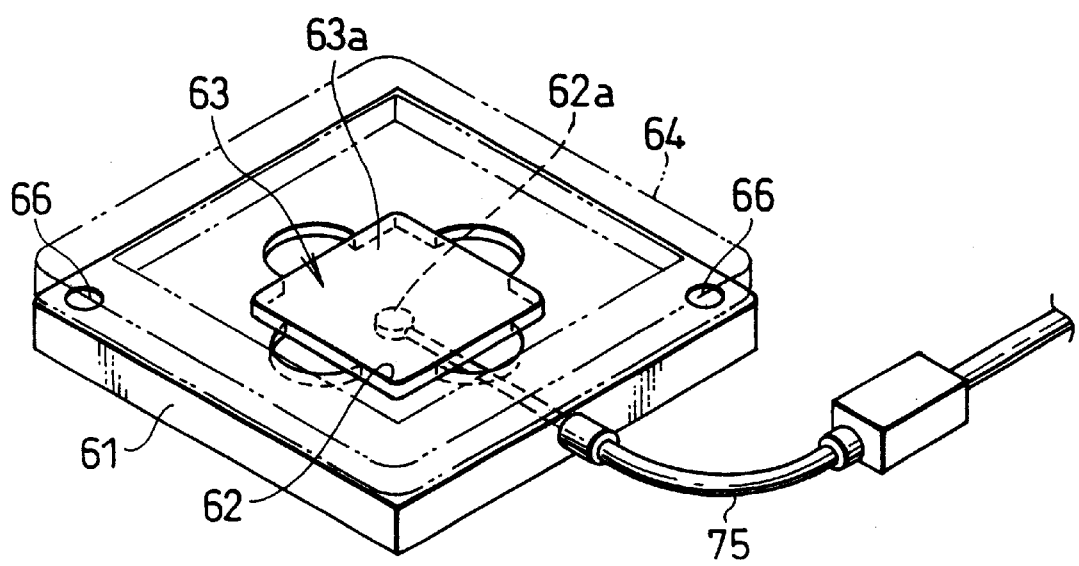

FIG.7
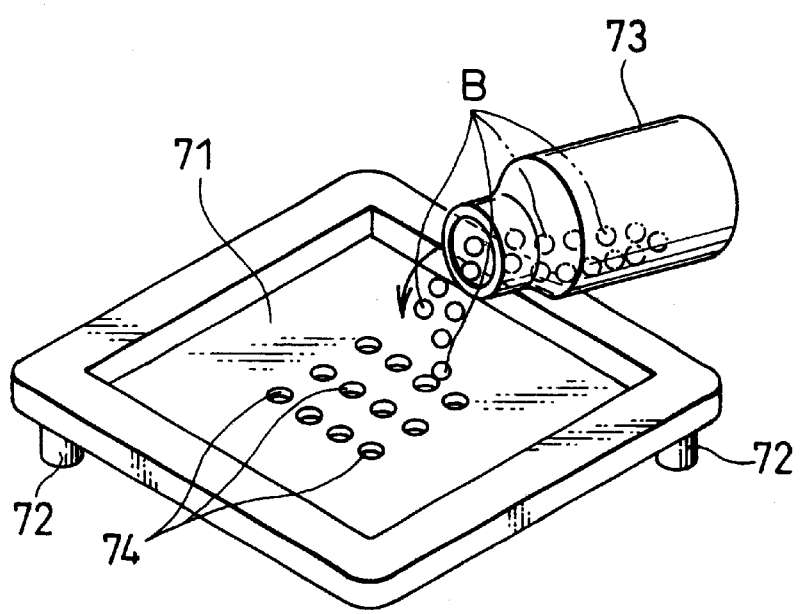
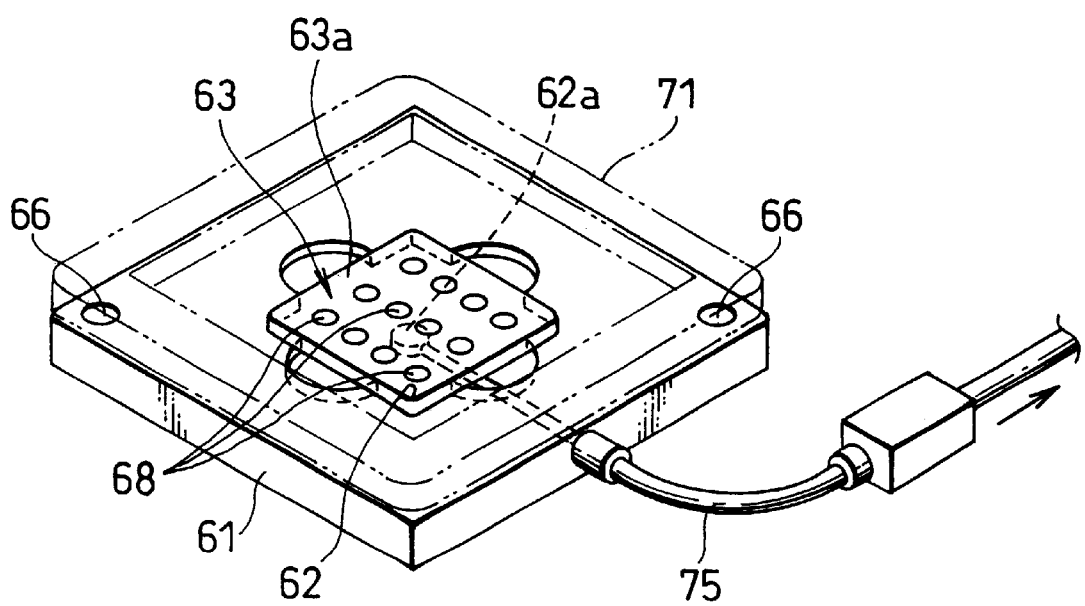

SOLDER BALL PITCHER

RELATED APPLICATION DATA

The present application claims priority to Japanese Application No. P2000-241909 filed Aug. 11, 2000, which application is incorporated herein by reference to the extent permitted by law.

BACKGROUND OF THE INVENTION

1. Field of the Invention

This invention relates to the technical field of a solder ball pitcher supplying solder balls for chip parts using solder balls as terminals, such as a BGA (a ball grid array), a CSP (a chip size package) or the like.

2. Description of the Related Art

A large number of solder ball supply jigs structured to make it possible to simultaneously supply a large number of solder balls to a terminal face of a chip part have been already developed, as disclosed in Japanese Patent Laid-open No. 7-25477.

SUMMARY OF THE INVENTION

However, development on any device or jig, which permits supply of solder balls one by one to a chip part, has not been developed yet.

For that reason, considerable difficulty is encountered in activities of restoring a defective unit of the chip part to a non-defective unit.

For instance, a defective unit is produced in some cases as a whole of a set in the process of passing a substrate packaged with a BGA into a product through an assembly process. In such cases, the BGA package has to be once removed from the substrate.

Since the BGA is nowadays a considerably expensive chip part, it is preferable to reuse the BGA removed from the substrate, if the device itself is still functioning. However, removal of the BGA from the substrate causes application of heat to the solder balls, resulting in unavailability of the solder balls. Thus, before remounting the BGA to the substrate, it is required to perform the process of mounting the solder balls to the terminal face of the BGA again after once completely removing solder from the terminal face of the BGA.

However, the solder ball is a standardized product having a diameter as considerably small as 0.76 mm, 0.6 mm or the like. Restoration of the BGA presents a problem that much manpower is required for mounting the above considerably small-sized solder balls one by one with a pinsetter or the like to the terminal face of the BGA.

One preferred embodiment of the present invention provides a solder ball pitcher, which can easily supply solder balls one by one to a chip part such as a BGA.

A solder ball pitcher according to the preferred embodiment of the present invention includes a solder ball housing chamber for storing a plurality of solder balls, a solder ball supply passage unit connected to the solder ball housing chamber for allowing supply of a plurality of solder balls in a row, and a solder ball delivery mechanism placed at a solder ball supply opening at the tip end of the solder ball supply passage unit as to deliver the solder balls one by one in sequence through the solder ball supply opening.

When the solder ball pitcher of the present invention having the above structure is inclined at a predetermined angle or more with the plurality of solder balls stored in the solder ball housing chamber, the solder balls in the solder ball housing chamber are supplied in a row through the solder ball supply passage unit. Then, the solder balls within the solder ball supply passage unit can be delivered one by one in sequence by the solder ball delivery mechanism through the solder ball supply opening at the tip end of the solder ball supply passage unit.

According to one preferred embodiment of the present invention, the solder balls may be supplied in a simple ways one by one to the chip part such as the BGA, providing high efficiency in working when pin-point mounting of the solder balls is required.

According to another preferred embodiment the present invention, it is possible to provide the solder ball pitcher of considerably high operability enough to perform the pin-point mounting or the like of the solder balls easily through the one-handed operation of pushing a pusher with a thumb while gripping the solder ball pitcher in one hand.

According to still another preferred embodiment of the present invention, the release lever is allowed to translate by the release link and the follower link, whereby providing higher operability of the pusher.

BRIEF DESCRIPTION OF THE DRAWINGS

The foregoing and other objects and features of the invention will become apparent from the following description of the embodiment with reference to the accompanying drawings, in which:

FIG. 6 is an exploded perspective view illustrating a solder printing process explaining the necessity of pin-point mounting in a process of mounting solder balls to a chip part such as a BGA, according to a preferred embodiment of the present invention;

FIG. 7 is an exploded perspective view illustrating the solder ball mounting process carried out in succession to the process of FIG. 6, according to the preferred embodiment of the present invention;

DETAILED DESCRIPTION OF THE PREFERRED EMBODIMENTS

Figure 1:
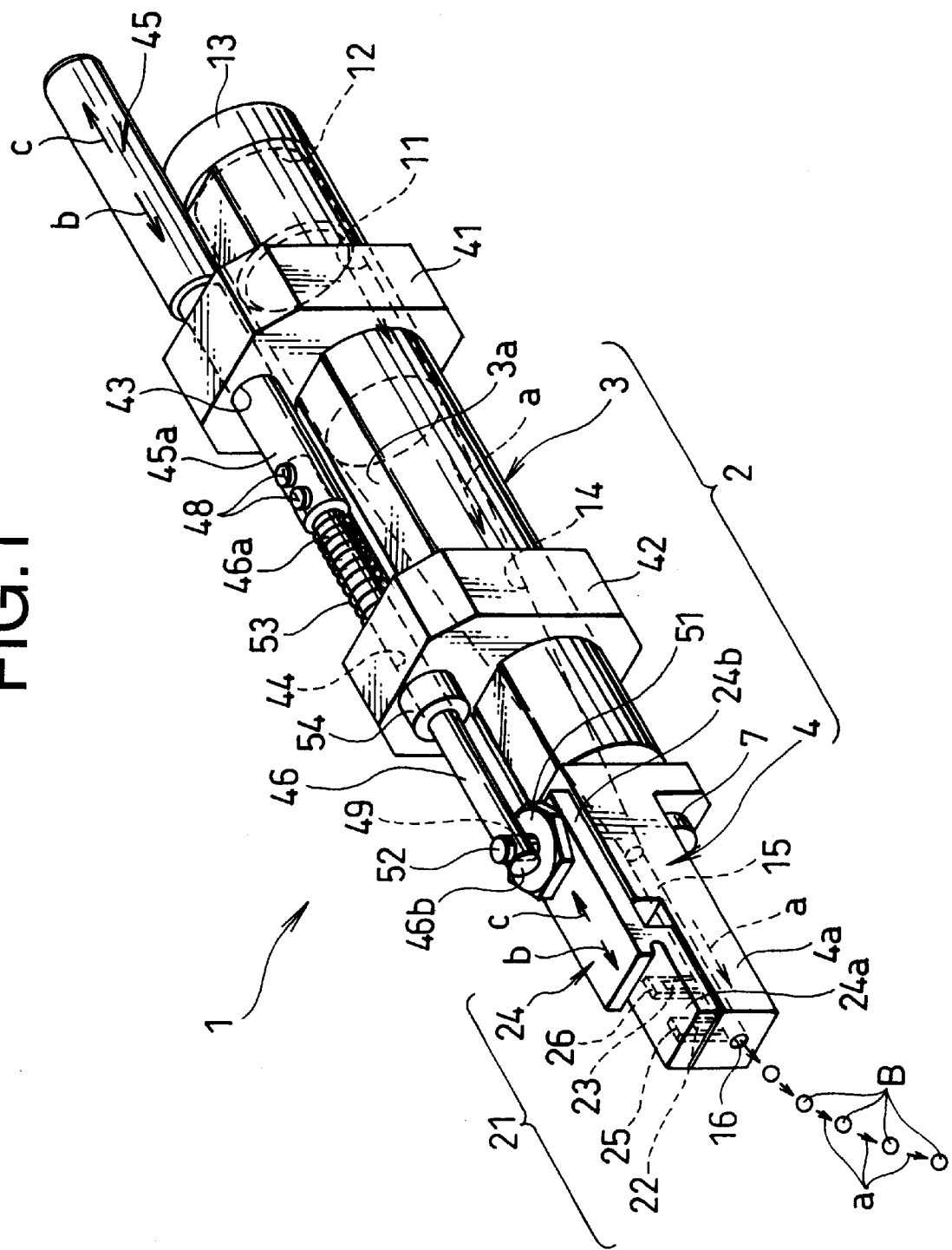
FIG. 1 is a perspective view illustrating an embodiment of a solder ball pitcher, according to a preferred embodiment of the present invention.
Figure 2:
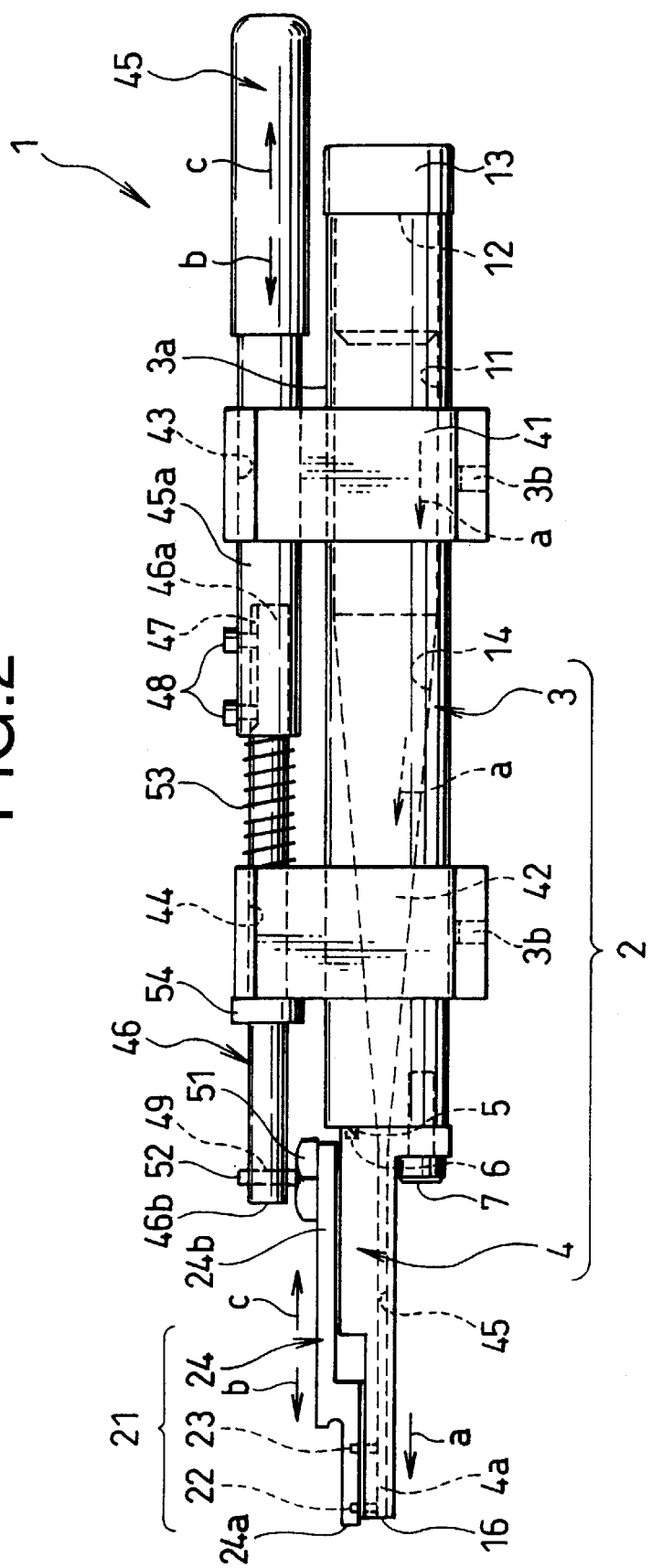
FIG. 2 is a side view showing the solder ball pitcher of FIG. 1, according to the preferred embodiment of the present invention.

A preferred embodiment of a solder ball pitcher, to which the present invention is applied, will be explained below with reference to the accompanying drawings in the order of the solder ball pitcher and the necessity of pin-point mounting in the process of mounting solder balls to a a chip part.

(1) Description of the Solder Ball Pitcher

A description will be firstly given of a solder ball pitcher 1 according to a preferred embodiment of the present invention, with reference to FIG. 1 to FIG. 5. The solder ball pitcher 1 according to the embodiment has a solder ball pitcher body 2 composed of a cylinder-shaped solder ball housing chamber block 3 and a square-shaped solder ball supply opening block 4 tightly connected to the tip end of the solder ball housing chamber block 3. The solder ball supply opening block 4 is tightly connected to the tip end of the solder ball housing chamber block 3 with a tightening screw 7 after being located by a location dowel 5 and a dowel hole 6.

The solder ball housing chamber block 3 has a cylinder-shaped solder ball housing chamber 11 along the center. A large number of solder balls B are supplied into the solder ball housing chamber 11 through a solder ball chute 12 opened at the rear end of the solder ball housing chamber 11, and the solder ball housing chamber 11 is tightly sealed with a detachable cap 13.

The tip end of the solder ball housing chamber 11 is formed in the shape of a forwardly narrower taper portion. A tip end portion as a smallest inner diameter portion of the taper portion 14 is coaxially connected to the rear end of a linear-shaped solder ball supply passage unit 15 formed over the overall length of the solder ball supply opening block 4.

The solder ball supply passage unit 15 has an inner diameter slightly larger than the diameter of each solder ball B. Thus, the large number of solder balls B in the solder ball housing chamber 11 are forwarded in sequence in the direction of arrow "a" through the taper portion 14 by the action of rolling downwards due to their own weights, resulting in supply of the solder balls in a row into the solder ball supply passage unit 15. A solder ball supply opening 16 for supplying the solder balls B one by one in sequence is provided in the tip end of the solder ball supply passage unit 15.

A solder ball delivery mechanism 21 for delivering the solder balls B one by one is mounted to the solder ball supply opening 16.

Figure 4:
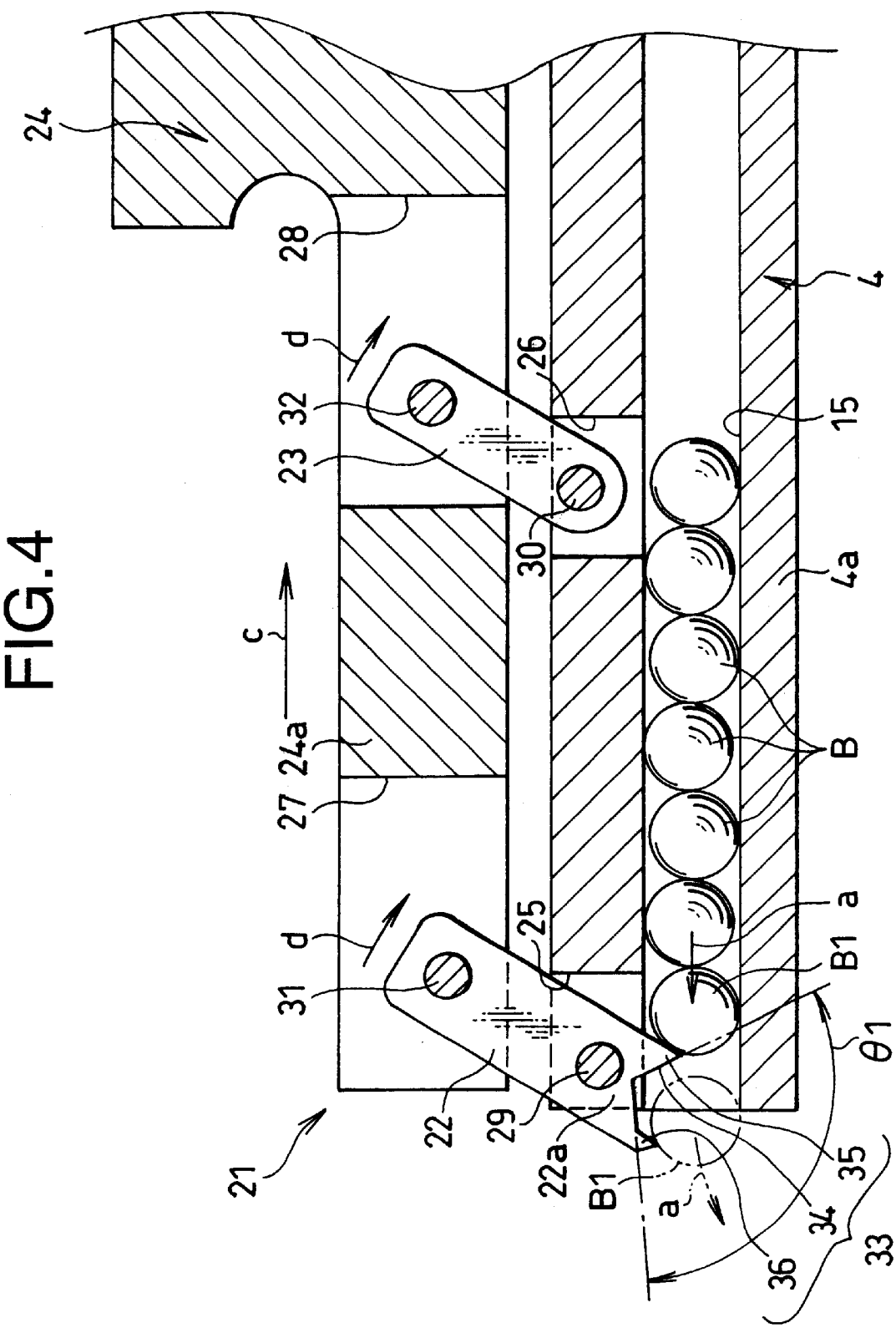
FIG. 4 is a cross sectional lateral view illustrating a solder ball delivery mechanism of the solder ball pitcher of FIG. 1, according to the preferred embodiment of the present invention.

The solder ball delivery mechanism 21 has a release link 22, a follower link 23 and a release lever 24 as shown in FIG. 4, for instance. The release link 22 and the follower link 23 are placed vertically across slits 25, 27 and slits 26, 28. The slits 25, 26 are formed vertically in portions of the front end 4a of the solder ball supply opening block 4, while the slits 27, 28 are formed vertically in portions of the front end 24a of the release lever 24. The upper and lower ends of the release link 22 and those of the follower link 23 are mounted to the solder ball supply opening block 4 and the release lever 24 so as to swing in parallel to each other with a pair of supporting pins 29, 30 at the fixed side and a pair of supporting pins 31, 32 at the moving side. A parallel quadruple link mechanism for allowing the release lever 24 to translate relatively to the solder ball supply opening block 3 in the directions of arrows b, c is formed by the release link 22, the follower link 23 and the release lever 24.

The release link 22 is disposed above the solder ball supply opening 16. A solder ball delivering active portion 33 for delivering the solder balls B one by one in sequence is formed at an action end 22a as a lower end of the release link 22. The solder ball delivering active portion 33 is composed of a recess portion 34 opened at an angle $\theta_1$ of about 180 degrees in the direction of arrow "a" as the solder ball delivery direction and also in the opposite direction, and a pair of claw portions 35, 36 provided at the front and rear sides of the recess portion 34.

A pair of front and rear fixed blocks 41, 42 are fixedly mounted at an interval to the outer periphery of the solder ball housing chamber block 3 in the state of being fitted thereto. In this case, the rotation of the fixed blocks 41, 42 is regulated by a chamfered portion 3a formed on an outer peripheral surface portion of the cylinder-shaped solder ball housing chamber block 3 in parallel to the axial direction, and in this state, the fixed blocks 41, 42 are fastened to the solder ball housing chamber block 3 with set screws 3b. A pair of through holes 43, 44 extending in parallel to the solder ball housing chamber block 3 are formed in upper end portions of the pair of front and rear fixed blocks 41, 42. A small diameter portion 45a at the tip end of a cylinder-shaped pusher 45 is held so as to freely slide in the directions of arrows "b", "c" as the forward and backward directions so as to being inserted forward into the rear side through hole 43. On the other hand, a cylinder-shaped connecting shaft 46 is held so as to freely slide in the directions of arrows "b", "c" in the state of being inserted rearwards into the front through hole 43. A chamfered rear end portion 46a of the connecting shaft 46 is connected coaxially to the pusher 45 with a pair of set screws 48 in the state of being inserted into an axial hole 47 formed in the center of the front end side of the small diameter portion 45a of the pusher 45.

A frontend portion 46b of the connecting shaft 46 is projected up to the position above a rear end portion 24b of the release lever 24, and a through hole 49 is formed vertically in the front end portion 46b. A connecting pin 52 projected vertically from the rear end portion 24b of the release lever 24 in the state of being fastened with a nut 51 after being screwed into a tapped hole 50 formed in the rear end portion 24b is inserted upwards into the through hole 49 of the front-end portion 46b of the connecting shaft 46 so as to slide in a vertical direction. The rear end portion 24b of the release lever 24 is connected to the connecting shaft 46 through the connecting pin 52 such that the release lever 24 may be displaced in the vertical direction.

A compressive coil spring 53 serving as a slide forcing means is fitted to the outer periphery of the connecting shaft 46 in a location between the front-side fixed block 42 and the front end of the small diameter portion 45a of the pusher 45. The pusher 45 is energized by the action of the compressive coil spring 53 to slide in the direction of arrow "c", i.e., toward the rearside. The slide position of the pusher 45 in the direction of arrow "c" is regulated by contact of a stopper flange 54, which is integrally formed on the outer periphery of the connecting shaft 46 in a location closer to the front-end portion 46b, with the front-side fixed block 42 from the direction of arrow "c".

Figure 3:
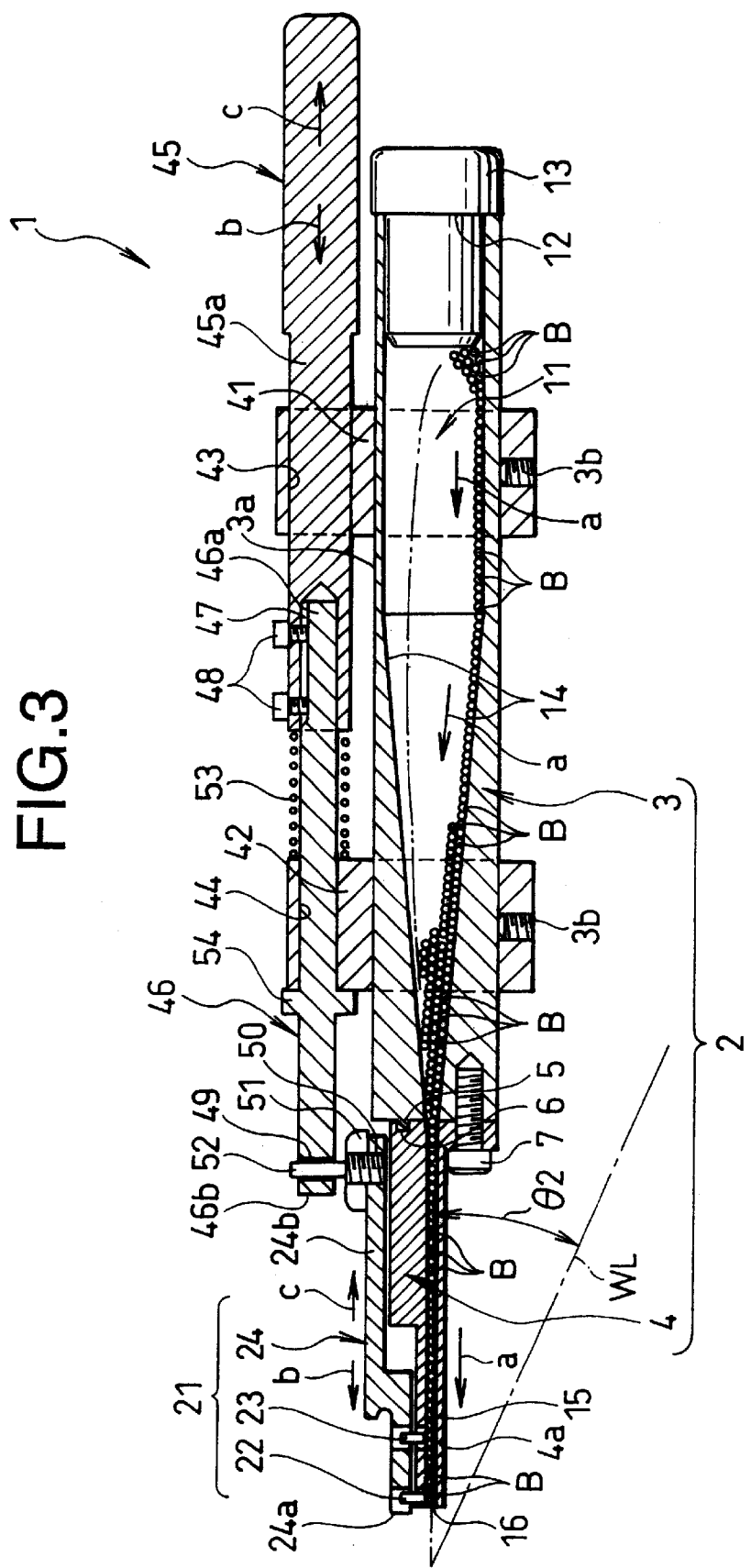
FIG. 3 is a cross sectional lateral view taken on an axis of the solder ball pitcher of FIG. 1, according to the preferred embodiment of the present invention.

In the state of the solder ball pitcher 1 closed up with the cap 13 after a large number of solder balls B are supplied into the solder ball housing chamber 11 as shown in FIG. 3, an operator grips the rear end side of the solder ball pitcher body 2 in one hand and then puts the thumb on the rear end of the pusher 45. According to the embodiment of the present invention, the solder ball pitcher 1, when inclined at an angle $\theta_2$ of a designated value or more with respect to a horizontal reference line WL, may deliver each individual solder ball B through the solder ball supply opening 16 in the direction of arrow a whenever the operator performs an operation (one-push operation) of pushing the pusher 45 with the thumb against the compressive coil spring 53 in the direction of arrow b and then releasing the thumb from the pusher 45 for pushing back the pusher 45 in the direction of arrow c by the compressive coil spring 53.

In other words, when the solder ball pitcher 1 is inclined at the angle $\theta_2$ of a desiganated value or more with respect to the horizontal reference line WL, the large number of solder balls B stored in the solder ball housing chamber 11 are supplied in a row into the solder ball supply passage unit 15 through the taper portion 14 in the direction of arrow "a" by the action of rolling downwards due to their own weights.

In this place, the pusher 45 finishes sliding to be restored in the direction of arrow "c" by the action of the compressive coil spring 53, while the release lever 24 finishes movement to be restored in the direction of arrow "c" through the connecting pin 52.

In addition, with the movement of the release lever 24 in the direction of arrow "c", the release link 22 and the follower link 23 are allowed to swing around the pair of supporting pins 29, 30 at the fixed side on the side of the solder ball supply opening block 4 to be restored in the direction of arrow "d" through the pair of supporting pins 31, 32 at the moving-side. In this place, the recess portion 34 of the release lever 22 is inclined in the direction of arrow "a", and the forefront solder ball B1 among the solder balls B supplied in a row into the solder ball supply passage unit 15 is held by one claw portion 35 of the release link 22 in the state of being brought into contact therewith from the direction of arrow "a".

Figure 5:
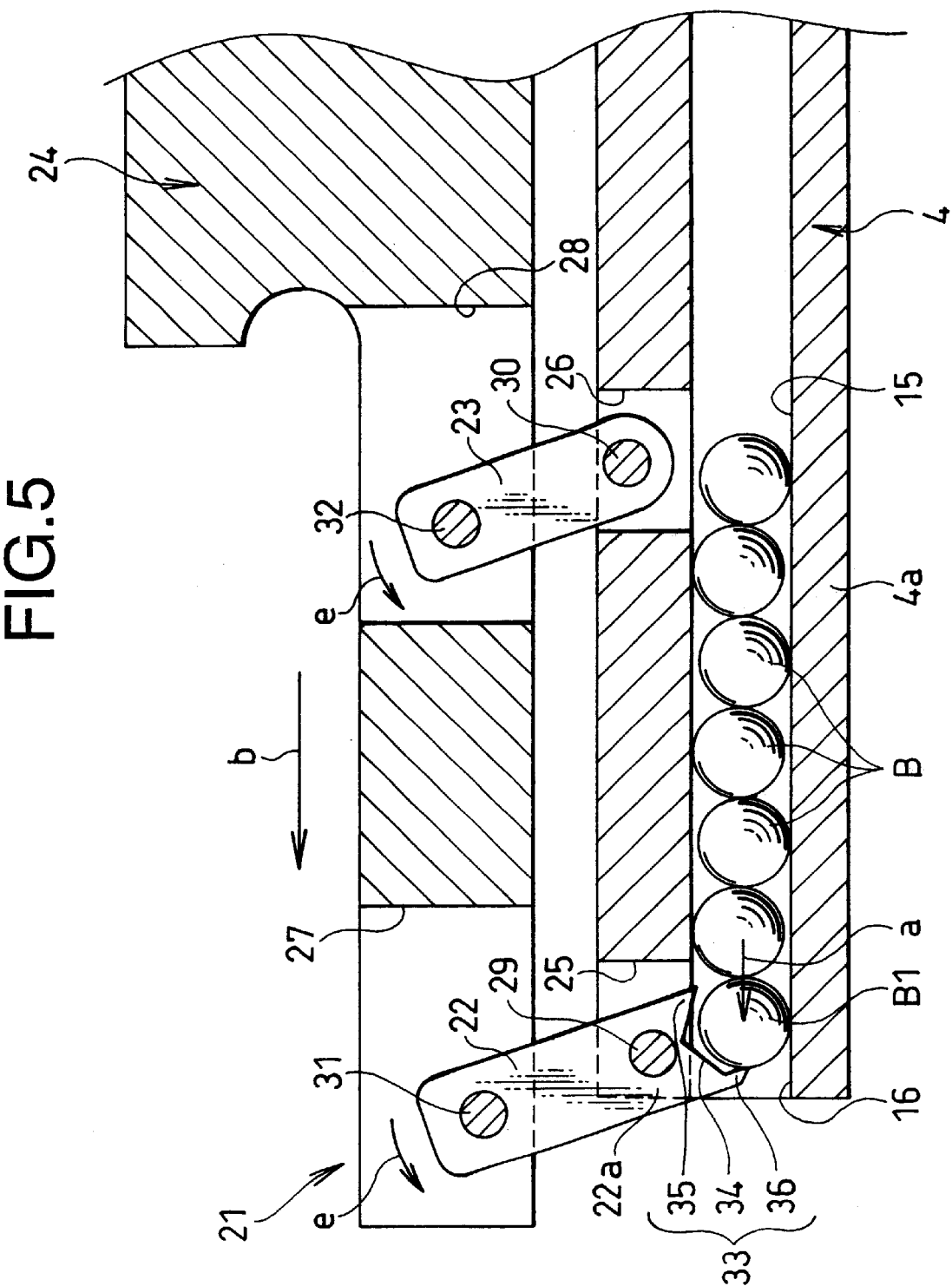
FIG. 5 is a cross sectional lateral view illustrating the solder ball delivery mechanism similar to FIG. 4, according to a preferred embodiment of the present invention.

In this state, when the release lever 24 is moved in the direction of arrow "b" through the connecting pin 52 by pushing the pusher 45 with the thumb in the direction of arrow "b" against the compressive coil spring 53, translation of the release lever 24 occurs in the direction of arrow "b" from the position shown in FIG. 4 to the position shown in FIG. 5. As a result, the release link 22 and the follower link 23 are allowed to swing around the pair of fixed-side supporting pins 29, 30 to be moved in the direction of arrow "e" through the pair of supporting pins 31, 32 at the moving side, and the recess portion 34 of the release lever 22 is inclined in the direction opposite to the direction of arrow "a".

Thereupon, while the whole solder balls B in a row within the solder ball supply passage unit 15 are pushed back slightly in the direction opposite to the direction of arrow "a" by one claw portion 35 of the release link 22, only the forefront solder ball B1 enters the recess portion 34 of the release link 22 in the direction of arrow "a" up to the position of the other claw portion 36.

Thereafter, the release lever 24 is allowed to translate in the direction of arrow "c" from the position shown in FIG. 5 to the position shown in FIG. 4 by releasing the thumb from the pusher 45 to slide the pusher 45 to be restored in the direction of arrow "c" by the action of the compressive coil spring 53. By so doing, the release link 22 and the follower link 23 are allowed to swing around the pair of fixed-side supporting pins 29, 30 to be restored in the direction of arrow "d" through the pair of supporting pins 31, 32 at the moving side. Thus, as shown by a chain line in FIG. 4, the individual solder ball B1 within the recess portion 34 of the release link 22 is automatically delivered to the outside in the direction of arrow "a" through the solder ball supply opening 16 of the solder ball supply passage unit 15 as being kicked out by one claw portion 35.

(2) Description Relating to the Necessity of Pin-point Mounting in the Process of Mounting the Solder Balls to the Chip Part A description will now be given of the process of mounting the solder balls to the chip part, together with solder ball pin-point mounting required for the above process, with reference to FIG. 6 to FIG. 9. The process of mounting the solder balls to the chip part is brought into practice in the order of a solder printing process and a solder ball mounting process.

First, in the solder printing process, a chip part 63 such as the BGA with its terminal face 63a turned up is located in the state of being horizontally fitted to a part positioning recess portion 62 in the center of an upper surface of a part positioning pallet 61, as shown in FIG. 6.

Subsequently, a solder printing screen 64 (of a thickness of about 130 $\mu$m) shown by a solid line of FIG. 6 is horizontally placed on the part location pallet 61 as shown by a chain line of FIG. 6 such that a pair of location pins 65 at the corners of the bottom surface of the solder printing screen 64 are fitted from above into a pair of location pin fit holes 66 at the corners of the upper surface of the part location pallet 61.

As shown by the solid line of FIG. 6, a large number of solder printing holes 67 of the solder printing screen 64 are coated with cream solder 68 for screen printing so as to stencil a large number of solder ball mounting positions on the terminal face 63a of the chip part 63 with the cream solder 68 through a large number of solder printing holes 67 by the use of a spatula 69.

In the subsequent solder ball mounting process, a solder ball mounting screen 71 (of a thickness of about 500 $\mu$m) shown by a solid line of FIG. 7 is horizontally placed on the part location pallet 61 as shown by a chain line of FIG. 7 such that a pair of location pins 72 at the corners of the bottom surface of the solder ball mounting screen 71 are fitted from above into a pair of location pin fit holes 66 at the corners of the upper surface of the part location pallet 61, after removal of the solder printing screen 64 having been used in the previous process. In this place, it is to be understood that a clearance slightly larger than the diameter of each solder ball B is provided between the printing face 63a of the chip part 63 and the bottom surface of the solder ball mounting screen 71.

As shown by the solid line of FIG. 7, a large number of solder balls B stored in a solder ball container 73 are deposited in the solder ball mounting screen 71 in a scattered state. Then, the large number of solder balls B are passed downwards through a large number of solder ball through holes 74 of the solder ball mounting screen 71 for mounting the large number of solder balls B to a large number of cream solder portions 68 at the solder ball mounting positions having been printed on the terminal face 63a of the chip part 63 according to the previous solder printing process.

Incidentally, in this case, suction of air, if made concurrently through a central portion 62a in the bottom of the part location recess portion 62 by a vacuum pipe 75 connected to the part location pallet 61, makes it possible to easily adhere the large number of solder balls B to the large number of cream solder portions 68.

Figure 8:
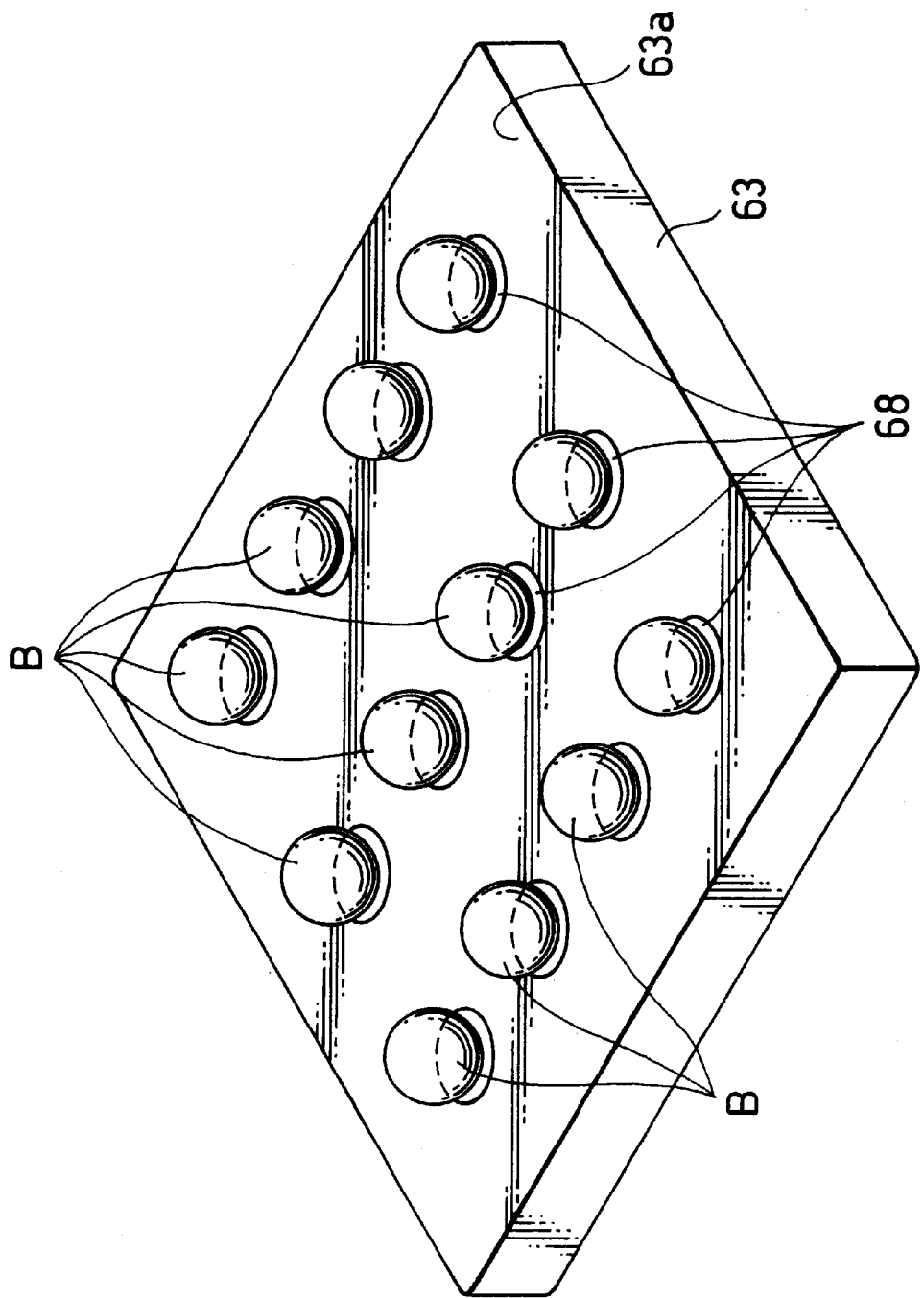
FIG. 8 is a perspective view showing the state of solder balls packaged 100 percent to the chip part such as the BGA.

The above solder ball mounting process, if completely carried out, brings about complete mounting of the large number of solder balls B to the large number of cream solder portions 68 on the terminal face 63a of the chip part 63 as shown in FIG. 8.

Figure 9:
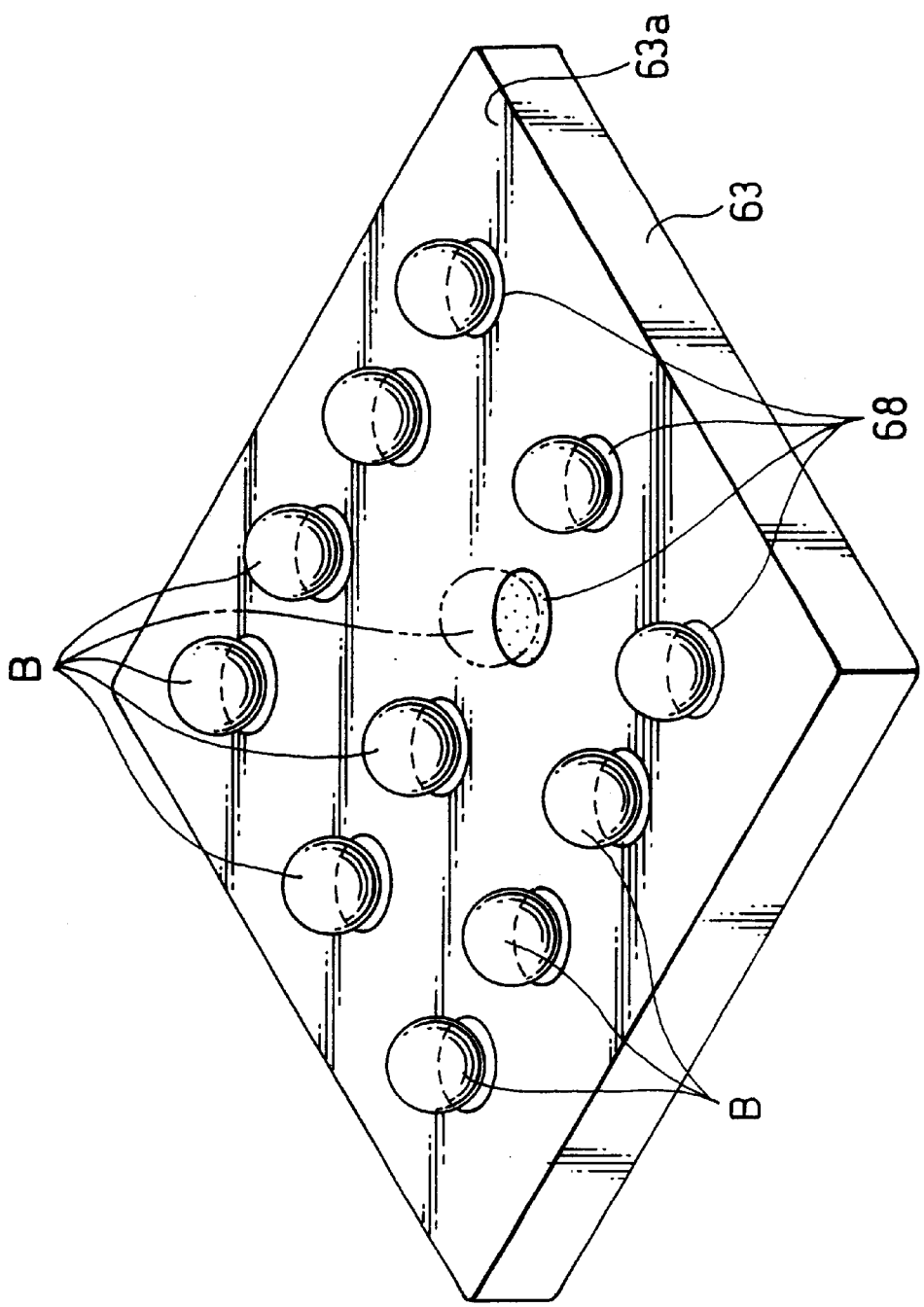
FIG. 9 is a perspective view explaining the necessity of pin-point mounting when mounting miss occurs in the process of mounting the solder balls to the chip part such as the BGA, according to a preferred embodiment of the present invention.

However, if the operator fails to put the solder ball B into one of the solder ball through holes 74 of the solder mounting screen 71, or one of the solder ball through holes 74 is clogged with the solder ball B and so on, defective mounting of one solder ball B or the like occurs in some cases as shown by a chain line of FIG. 9.

When the above mounting miss of the solder ball B occurred, a work of picking out the solder balls B from the solder ball container 73 one by one with a pinsetter has been conventionally required before pin-point mounting of the solder ball B to the cream solder portion 68 where the solder ball B is missing. However, this work is considerably inconvenient and presents a problem that much time is required and so on.

On the other hand, the use of the solder ball pitcher 1 of the present invention makes it possible to perform the above pin-point mounting easily with accuracy, permitting a remarkable improvement on operation efficiency.

That is, as described the above, while gripping the solder ball pitcher 1 in one hand to bring the solder ball supply opening 16 close to the cream solder portion 68, where the solder ball is missing, on the chip part 63 shown by the chain line of FIG. 9, the operator may perform pin-point mounting easily with accuracy only by once push and release operation of the pusher 45 with the thumb to supply only one solder ball B through the solder ball supply opening 16 to the above cream solder portion 68.

Although the present invention has been described in its preferred form, it is to be understood that the present invention is not limited to the above embodiment and various changes may be made based on the technical scope of the present invention. For instance, while both the pusher 45 and the compressive coil spring 53 as the slide forcing means are used for driving the release lever 24 in the solder ball delivery mechanism 21 in the above embodiment, it is to be understood that a pistol trigger mode may be also applied to drive the release lever 24. While the solder ball delivery mechanism 21 in the above embodiment is structured to deliver the solder balls B one by one by the single release link 22 driven to swing around the supporting pin 29, it is to be understood that various changes of the solder ball delivery mechanism 21 may be made. For instance, the solder balls B may be delivered one by one by alternately opening and closing two pieces of ball stoppers placed in the solder ball supply opening 16 at an interval as large as the individual solder ball B.

Finally, the configurations and structures of respective units and portions described specifically with respect to the preferred embodiments of the present invention are only examples of realization of the present invention, so the embodiments thereof should not be construed as to limiting the technical scope of the present invention.

What is claimed is:

1. A solder ball pitcher, comprising:
   a solder ball pitcher body;
   a solder ball housing chamber formed in a cylindrical shape along the center of said solder ball pitcher body for storing a plurality of solder balls;
   a solder ball supply passage unit connected to the tip end of said solder ball housing chamber through a taper portion to allow the plurality of solder balls in the solder ball housing chamber to be supplied in a row;
   a solder ball supply opening provided at the tip end of said solder ball supply passage unit;
   a release link placed at said solder ball supply opening and allowed to swing around a supporting point for delivering the solder balls one by one in sequence through said solder ball supply opening;
   a release lever for swinging said release link;
   a pusher held by said solder ball pitcher body in substantially parallel thereto to swing said release lever in one direction; and
   a slide forcing means for driving said release lever to swing in the other direction by forcing said pusher to slide in a direction of restoration.

2. A solder ball pitcher according to claim 1, wherein said release lever is allowed to translate by said release link and a follower link parallel to said release link.

3. A solder ball supply device, comprising:
   a solder ball housing portion for storing a plurality of solder balls;
   a solder ball supply opening portion having an opening for supplying the solder balls to an outside of the solder ball supply device; and
   a solder ball delivery mechanism for delivering the solder balls stored in said solder ball housing portion one by one to said solder ball supply opening portion, said solder ball delivery mechanism comprising
      a release link configured to swing around a supporting point for delivering the solder balls one by one through the opening, and
      a release lever for causing the release link to swing for delivery of one of the solder ball through the opening.

4. A method for mounting solder balls to a chip part, comprising the steps of:
   mounting a plurality of solder balls to said chip part; and
   supplying at least one of said solder balls for mounting to said chip part by a solder ball supply device, comprising:
      a solder ball housing portion for storing a plurality of solder balls;
      a solder ball supply opening portion having an opening for supplying the solder balls to an outside of the solder ball supply device; and
      a solder ball delivery mechanism for delivering the solder balls stored in said solder ball housing portion one by one to said solder ball supply opening portion, said solder ball delivery mechanism comprising:
         a release link configured to swing around a supporting point for delivering the solder balls one by one through the opening, and
         a release lever for causing the release link to swing for delivery of one of the solder ball through the opening.

* * * * *